March 7, 1967 C. F. DAVIS, JR., ET AL 3,308,355

POINT CONTACT DIODE

Filed July 30, 1962

Charles F. Davis, JR.
Arthur M. Lueck
INVENTORS

BY John D. Graham

ATTORNEY

United States Patent Office 3,308,355
Patented Mar. 7, 1967

3,308,355

POINT CONTACT DIODE

Charles Freeman Davis, Jr., and Arthur Mitchell Lueck, Dallas, Tex., assignors to Texas Instruments Incorporated, Dallas, Tex., a corporation of Delaware Filed July 30, 1962, Ser. No. 213,269
5 Claims. (Cl. 317—236)

This invention relates to semiconductor diodes and more particularly to a high-frequency point contact mixer diode having a very low series inductance.

Ideally, point contact diodes would be very well suited for extremely high frequency applications because the area of the rectifying contact is extremely small. However, diodes of this type made by conventional techniques exhibit relatively high series inductance due to the catwhisker or wire of the point contact. This series inductance becomes quite significant at frequencies in the kilomegacycle range, and necessitates using the diode over a relatively narrow bandwidth.

It is the principal object of this invention to provide a point contact diode having a small series inductance. Another object is to provide a semiconductor diode suitable for extremely high frequency use. A further object is to provide an improved point contact device which is capable of broad band operation.

In accordance with this invention a point contact is made to a semiconductor wafer through a relatively large area wire mesh. The mesh then becomes the conductor for one electrode of the diode, rather than the small diameter whisker wire, thus considerably reducing the apparent series inductance.

Figure 1:
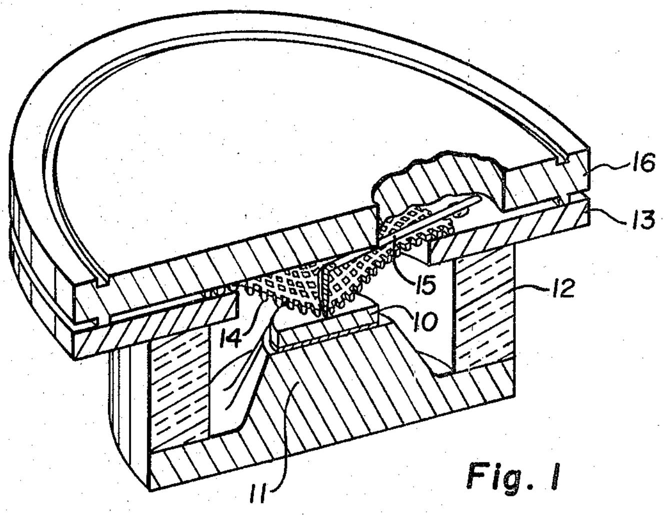
Figure 2:
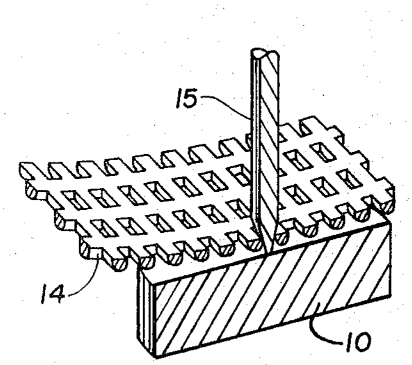

The novel features characteristic of the invention are set forth in the appended claims. The invention itself, however, along with other objects and advantages thereof, may be best understood from the following detailed description, when read in conjunction with the accompanying drawing, wherein:

FIG. 1 is a pictorial view in section of a point contact diode constructed in accordance with this invention; and FIG. 2 is a greatly enlarged view of the contact area of the diode of FIG. 1.

With reference to FIG. 1, a diode assembly using the principles of this invention is shown, the particular device being an extremely high frequency mixer diode operable at perhaps 70 kmc. and all lower frequencies. This device uses a wafer 10 of semiconductor material which may be *n*-type gallium arsenide doped with tin or tellurium to a level of about $2 \times 10^{17}$ atoms/cc. Conveniently, the size would be 20 mils diameter by three mils thick. The wafer 10 is mounted on a base plate 11 by means of a low melting point solder such as tin-gold or Alpha Alloy #525. The base plate may be composed of gold-plated Kovar, and has previously been assembled with an insulating sleeve 12 brazed thereto, the sleeve being suitably composed of a ceramic such as beryllium oxide. A conductive ring 13 is brazed to the top of the sleeve to provide the other electrode of the diode.

A gold wire mesh 14, having been precut to a diameter of 90 mils, is formed into a shallow dish-shaped configuration by a suitable die and is secured to the ring 13 by spot welding. The dish-shaped protrusion of the mesh 14 extends down to a position about .003 inch from the top surface of the wafer 10. The mesh may be composed of gold-plated nickel wire wherein the individual conductors are of about one mil diameter, the conductors being spaced from one another by about one mil.

A point contact 15 is provided by a 3 mil molybdenum wire which has been pointed on the lower end by a conventional electrolytic process. The point is preferably rounded with a diameter of perhaps 0.1 to 0.5 mil, depending upon the desired characteristics of the diode. The wire 15 is bent in a right angle by a forming jig so that the length between the point and the bend is about 20 mils. The distance between the top surface of the wafer 10 and the top surface of the ring 13 is about 16 mils, so that when the wire 15 is secured to the ring it will be bent slightly to provide the appropriate pressure for the point contact. The wire 15 is bonded to the ring 13 by welding at a position about 35 mils from the bend or whatever distance provides the appropriate pressure on the point. As may be best seen in FIG. 2, the wire 15 will make a good electrical contact to the mesh 14 at the point where it passes through just above the wafer 10. At this point, the wire diameter is somewhat less than the original 3 mils, but still large enough to spread the conductors of the mesh and ensure good contact. In addition, the wire may be bonded to the mesh 14 by soldering with tin in a hydrogen atmosphere, for example, or by using a conductive epoxy. Pulse forming techniques may be used to provide a good rectifying contact between the point of the wire 15 and the semiconductor wafer 10.

The encapsulation of the device is completed by securing a disc 16 over the open top of the package. This may be done by welding or any other suitable technique. The disc 16 thus forms one electrode of the diode and the base plate forms the other.

The concept of a low inductance point contact diode can be extended to include point contact tunnel diodes, varactors, and so forth. Such a tunnel diode would be made using more heavily doped material, $10^{19}$ to more than $10^{20}$ atoms/cc., and another whisker material, but bonding by pulsing or other techniques would be used and the resultant device would have low inductance due to use of the mesh.

While the invention has been described with reference to a particular embodiment, this description is not to be construed in a limiting sense. Various modifications of the invention may be made by persons skilled in the art, so it is contemplated that the appended claims will cover any such modifications as fall within the true scope of the invention.

What is claimed is:

1. A high frequency diode comprising:

(a) a wafer of single crystal semiconductor material,
(b) a conductive plate with said wafer being secured to one side of the plate,
(c) an insulating sleeve surrounding said wafer and secured to said one side of said plate,
(d) a conductive member secured to one end of said insulating sleeve and defining an aperture,
(e) a conductive cone-shaped mesh bonded directly to said conductive member and having its central apex portion extending through said aperture slightly spaced from said wafer, and
(f) an elongated conductive wire physically connected to the conductive member having an end extending through and physically in contact with said mesh and terminating in engagement with said wafer.

2. A semiconductor diode comprising spaced conductive members, a semiconductor wafer mounted on one of said members, a conductive, non-corrosive mesh connected to the other of said members, the center portion of said mesh having a dish-shaped configuration with an apex slightly spaced from said wafer, and an elongated conductive wire connected to said other member and extending in a spaced relationship with said mesh to the apex whereat said wire extends through and engages said mesh and contacts the surface of said wafer.

3. A contact arrangement for a semiconductor device comprising; an apertured conductive member, a cone-shaped conductive mesh secured to said conductive member and a portion thereof extended down through the aperture in said conductive member, a semiconductor wafer, means for mounting said wafer slightly below the downwardly extending portion of said mesh, and an elongated wire attached directly to and extending from said conductive member down through the center of said aperture, passing through and ohmically engaging said mesh and contacting the surface of said semiconductor wafer.

4. A semiconductor device comprising:
(a) a wafer of single crystal semiconductor material,
(b) a metallic base plate ohmically connected to the surface of said wafer to provide one electrode of the device,
(c) a metallic disc spaced from the first base plate and from the other surface of the wafer, the disc defining an aperture much larger than the lateral dimensions of the wafer,
(d) a conductive metallic wire mesh positioned over the aperture and extending therethrough to a position spaced from a face of said wafer,
(e) and a wire secured to the disc and extending through said aperture and through the mesh engaging the face of said wafer and making a rectifying contact thereto, said wire being conductively engaged with said mesh as it passes therethrough.

5. A high-frequency point contact diode comprising:
(a) a circular base plate,
(b) a ceramic sleeve secured to one side of the plate and concentric therewith, (c) a conductive ring mounted on the ceramic sleeve and concentric therewith,
(d) a semiconductor wafer ohmically connected to said one side of the base plate within said sleeve,
(e) a wire mesh secured to the conductive ring and having a central portion protruding through the center of the ring to a position slightly spaced from the face of said wafer, and
(f) an elongated conductive wire pointed on one end and bonded adjacent the other end to the conductive ring, said wire being bent at substantially right angles at a central point and stressed so that pressure is exerted by said pointed end on said wafer, said pointed end extending through and conductively engaging said wire mesh.

References Cited by the Examiner

UNITED STATES PATENTS

| | | | |
|---|---|---|---|
| 1,523,401 | 1/1925 | Chamberlin | 317—236 |
| 2,569,570 | 10/1951 | Matare | 317—236 |
| 2,878,399 | 3/1959 | Lair | 317—236 |
| 3,001,113 | 9/1961 | Mueller | 317—236 |
| 3,030,557 | 4/1962 | Dermit | 317—234 |

FOREIGN PATENTS

| | | |
|---|---|---|
| 160,879 | 10/1957 | Sweden. |

JAMES D. KALLAM, *Primary Examiner.*

JOHN W. HUCKERT, *Examiner.*